United States Patent [19]

Maturi et al.

[11] Patent Number: 5,696,462

[45] Date of Patent: *Dec. 9, 1997

[54] SERIAL CLOCK SYNCHRONIZATION CIRCUIT

[75] Inventors: Greg Maturi, Tracy; David R. Auld, San Jose; Anil Khubchandani, Sunnyvale, all of Calif.

[73] Assignee: LSI Logic Corporation, Milpitas, Calif.

[*] Notice: The term of this patent shall not extend beyond the expiration date of Pat. No. 5,528,183.

[21] Appl. No.: 620,703

[22] Filed: Mar. 21, 1996

Related U.S. Application Data

[63] Continuation of Ser. No. 191,890, Feb. 4, 1994, Pat. No. 5,528,183.

[51] Int. Cl.$^6$ .............................. H03K 5/26; H03L 7/00
[52] U.S. Cl. .................... 327/151; 327/48; 377/39; 377/50; 375/355
[58] Field of Search ....................... 327/144, 151, 327/40, 41, 42, 47, 48; 377/39, 50; 375/354, 355

[56] References Cited

U.S. PATENT DOCUMENTS

| | | | |
|---|---|---|---|
| 3,723,889 | 3/1973 | Oberst | 327/42 |
| 4,345,211 | 8/1982 | Longworth | 327/160 |
| 4,686,483 | 8/1987 | Isshiki et al. | 377/39 |
| 4,780,895 | 10/1988 | Paul | 377/39 |
| 5,170,417 | 12/1992 | Winter | 377/44 |
| 5,519,500 | 5/1996 | Kumamoto | 358/296 |

*Primary Examiner*—Timothy P. Callahan
*Assistant Examiner*—Terry L. Englund
*Attorney, Agent, or Firm*—Oppenheimer Poms Smith

[57] ABSTRACT

A low cost and easily implemented apparatus and method for synchronizing serially connected clock circuits is ideally suited to audio applications. The circuit takes data from a bitstream clock source and from the local source and counts the number of pulses received from each. A desired clock count is calculated based as a multiple of the ratio of the bitstream clock source frequency to the local clock signal frequency. Based on the samples received from the bitstream clock relative to the local clock at a later point in time, samples are either repeated or dropped to correct any error in the bitstream signal.

16 Claims, 3 Drawing Sheets

SERIAL CLOCK SYNCHRONIZATION CIRCUIT

This application is a continuation of U.S. patent application Ser. No. 08/191,890, filed Feb. 4, 1994, now U.S. Pat. No. 5,528,183, issued Jun. 18, 1996.

FIELD OF THE INVENTION

This invention relates to digital clock circuitry, and more particularly to synchronizing audio signals generated by non-synchronous sources.

BACKGROUND OF THE INVENTION

Digital signals are frequently encoded at a source location and decoded at a remote location. When the encoded signal is received at the remote decoding site, the decoding clock may operate at a different frequency than did the encoder clock upstream. If the decoder is not synchronized with the encoder, processed data may come into the decoder at too high a frequency, or the output from the decoder may not be available when required.

To overcome this serial clock synchronization problem, two methods have historically been employed. First, decoder clocks have been designed to perform at the identical rate of the encoder clock. However, over time, either the decoder or encoder clock may drift, causing the decoder not to have enough information or to have too much information when processing the signal. The decoder clock may be behind or ahead of the encoder clock even though both may have been designed to perform identically.

Phase lock loops (PLLs) have been employed to control synchronization and drift problems. Phase lock loops are well known within digital circuitry to provide frequency control. The problem with PLLs is that they are difficult to implement in digital ASICs (application specific integrated circuits). Further, audio signals will generally have a ratio of 1000 to 1 between encoder (remote) and decoder (local) clocks. With this ratio, PLLs frequently cause clock jitter, which significantly reduces the performance of digital audio circuits.

Phase lock loops generally are not be able to generate a fast enough shift for a digital-to-analog (D/A) converter. PLLs are too slow to make the dynamic frequency changes necessary for audio clock applications, and incorrect frequency response may cause errors in the decoder.

The second method used to solve the problem is to use hardware which detects that the decoder clock is behind or ahead of the encoder clock. The frequency of the oscillating device may then be changed using a voltage controlled crystal oscillator (VCXO). Detection devices, however, are expensive and add greatly to system complexity.

Accordingly, a principle object of the present invention is to provide circuitry which synchronizes serial digital bitstreams transmitted from an encoder to a decoder and provides optimum performance for misaligned decoder and encoder clocks.

A further object of this invention is to provide a low cost, low complexity digital audio clock synchronization circuit which is easy to implement, does not cause jitter or other audio performance degradation, and responds robustly to misaligned clock signals.

SUMMARY OF THE INVENTION

According to the present invention, there is provided a method and apparatus for synchronizing serial clock signals.

The serial clock synchronizing circuit takes data from the bitstream clock source, or remote source, as well as the sampling clock signal source, or local source, and counts the number of pulses received from the bitstream clock and from the sampling clock signal source. A desired clock count is calculated based on bitstream clock source frequency and sampling clock signal frequency, where the desired clock count is the ratio of the bitstream clock source frequency to the sampling clock signal frequency. The output from the sampling clock is then compared to the desired clock count to determine a point in time when the bitstream clock pulse should be received. The output from this comparison is then used to monitor the bitstream clock, and a second comparison is made correlating output from the first comparison to the output from the bitstream clock counter. Based on the data available from the bitstream at the time the second comparison indicates a new sample should be received, the circuit either transmits the sample if it is correct, drops the sample when the output from the bitstream clock counter is greater than the output from the second comparison, or repeats the previous sample when the output from the bitstream clock counter is less than the output from the second comparison. A clear line is also provided to reset the counters once the second comparison has occurred.

While ideally suited for audio applications, it is understood that this apparatus and method may be used in other applications where two clocks serially connected require synchronization. The present invention performs the synchronizing function in a low cost and low complexity manner, and obviates the need for phase lock loops by eliminating jitter in the received (decoded) signal. Other objects, features, and advantages of the present invention will become more apparent from a consideration of the following detailed description and from the accompanying drawings.

DESCRIPTION OF THE PREFERRED EMBODIMENT

Figure 1:
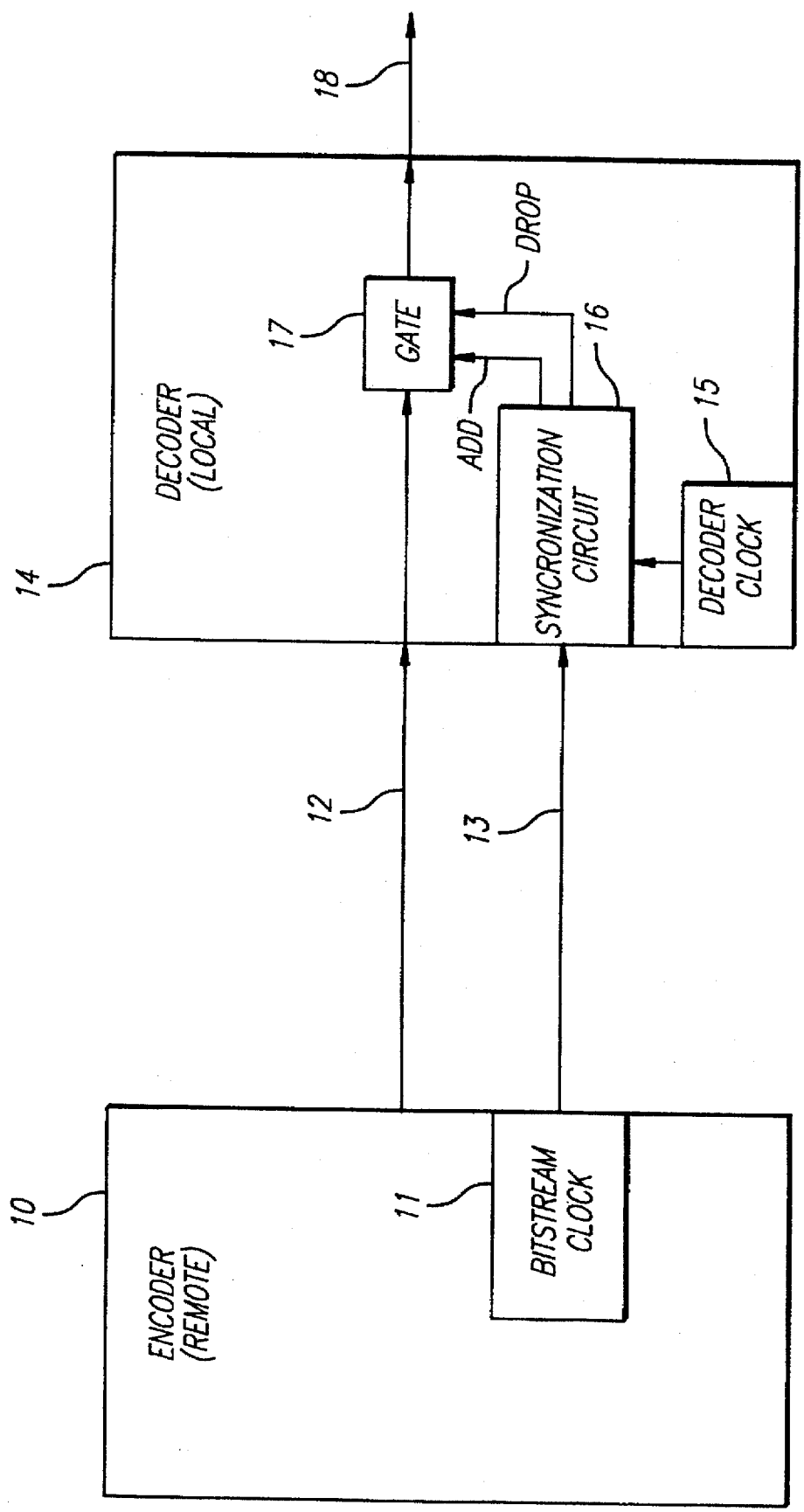
FIG. 1 shows the encoder-decoder relationship.

As shown in FIG. 1, encoder 10 processes the audio data so that it can be transmitted to a different location. Encoder 10 transmits the data via transmission medium 12, which may be a satellite linkage, cabling, or other means of transmitting digitized data. The data to be transmitted is encoded at a certain rate in encoder 10, and that rate is determined by bitstream clock 11. Bitstream clock 11 operates at a specified frequency, which may or may not be the same as the decoder clock 15. Clock signals are transmitted from bitstream clock 11 to the decoder 14 and synchronization circuit 16 by way of clock transmission medium 13, which is coupled with transmission medium 12 to transmit both raw data and clock data. Based on information received from synchronization circuit 16, gate 17 will either let data pass, add, or drop data received from transmission medium 12. Data then exits decoder 14 via output link 18.

Figure 2:
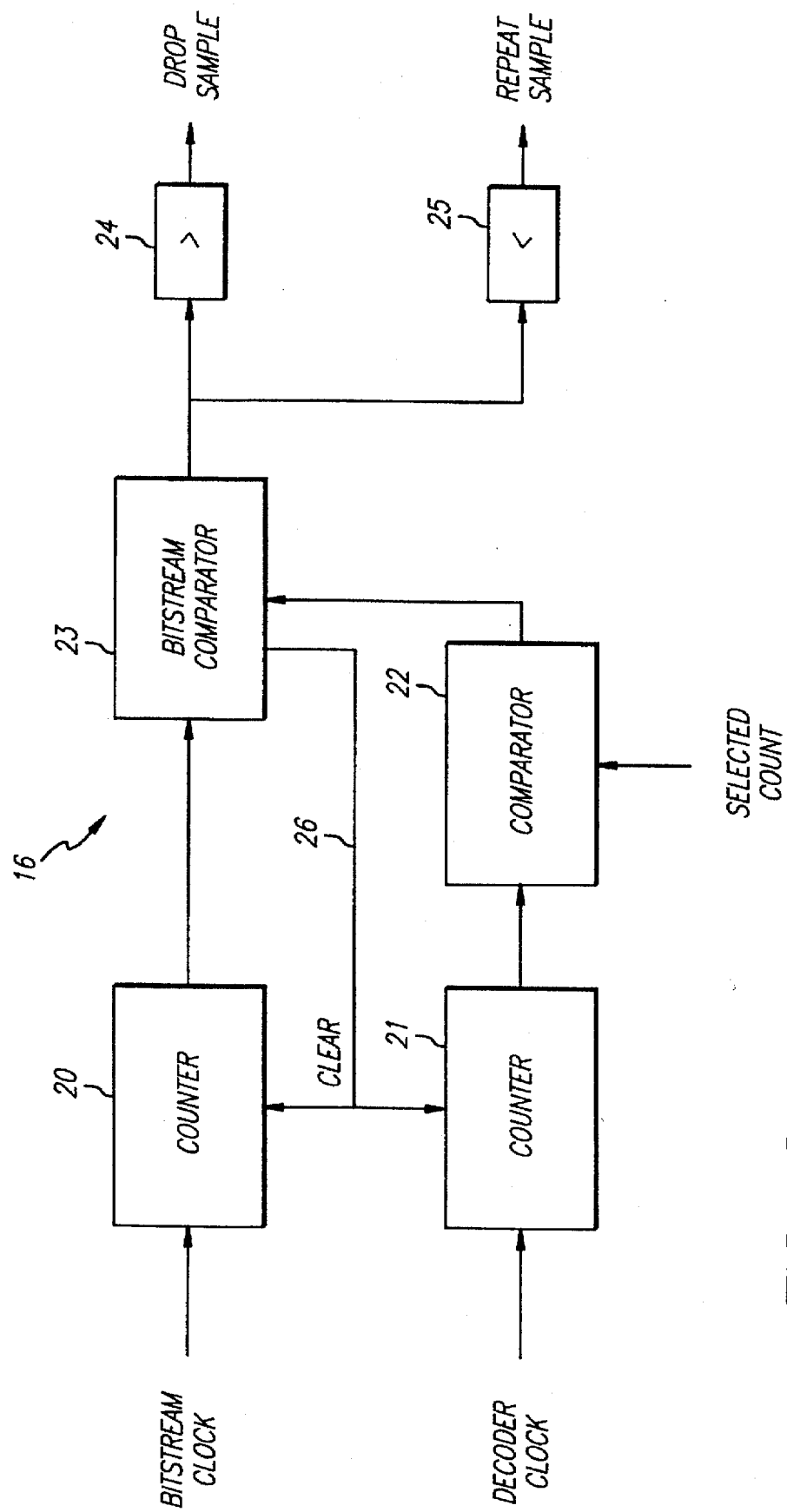
FIG. 2 illustrates a synchronization circuit of the disclosed invention.

FIG. 2 shows the mechanization of the synchronization circuit. Bitstream clock information, transmitted via clock transmission medium 13, is received by the bitstream clock counter 20. Bitstream clock counter 20 counts the number of samples or pulses received by the bitstream clock. Local clock information, obtained from decoder clock 15, is received at the decoder clock counter 21. The source for the decoder clock 15 is typically a voltage controlled crystal oscillator (VCXO), but may be any oscillating device. Decoder clock counter 21 counts the number of pulses received from the decoder clock 15.

A selected, or desired, clock count is determined based on the frequency of the bitstream clock 11 in relation to the frequency of the decoder clock 15. A simple example would be if bitstream clock 11 operates at 2 hz, and decoder clock 15 operates at 10 hz, the selected or desired count would be 5. The comparator 22 takes the selected count of 5 and compares it to the output from decoder clock counter 21, i.e. determines when 5 samples are received from decoder clock counter 21. Once the fifth sample is received at comparator 22, comparator 22 transmits this information to bitstream comparator 23. Bitstream comparator 23 then determines whether the bitstream clock counter 20 has transmitted one pulse since the last evaluation, that is, if the bitstream clock counter 20 has a value of one. If the bitstream clock counter 20 has a value of one, no modification of the sampling in the decoder is necessary as the decoder clock 15 and bitstream clock 11 are synchronized. However, if the count from bitstream clock counter 20 is greater than one, drop sample indicator 24 operates to indicate that an audio sample should be dropped, and sends a DROP SAMPLE signal to the gate 17. If the count from bitstream clock counter 20 is less than one, then repeat sample indicator 25 operates to indicate that the last audio sample from the bitstream should be repeated, and sends a REPEAT SAMPLE signal to the gate 17. If the gate 17 does not receive a DROP SAMPLE signal or a REPEAT SAMPLE signal, it will pass data therethrough in a normal manner.

When the evaluation has been made by bitstream comparator 23, clear line 26 operates to reset both bitstream clock counter 20 and decoder clock counter 21 to zero. The clear line 26 thus avoids error accumulation.

The simple example outlined above is merely for illustration, as the actual ratios between the frequencies of audio bitstream clocks and decoder clocks are on the order of 1000 to 1. Further, as audio is always sampling at twice the Nyquist frequency, dropping or adding a sample using drop sample indicator 24 or repeat sample indicator 25 will be undetectable to the listener, a clear advantage in audio applications. However, if dropping or adding is imperceptible to the end user, such as in video or other data transfer applications, synchronization circuit 16 may be used. Clock signals are generally very accurate, so drop sample indicator 24 or repeat sample indicator 25 may not be used in most circumstances. Typically, however, larger numbers are applied in audio applications, such as a decoder clock 15 operating at 2000 hz and bitstream clock 11 operating at 100 hz, with a selected count of 1000 for highly accurate clocks. In such a situation, once decoder clock counter 21 reaches 1000, bitstream comparator 23 evaluates whether bitstream clock counter 20 has a value which is greater than, less than, or equal to 50.

Figure 3A:
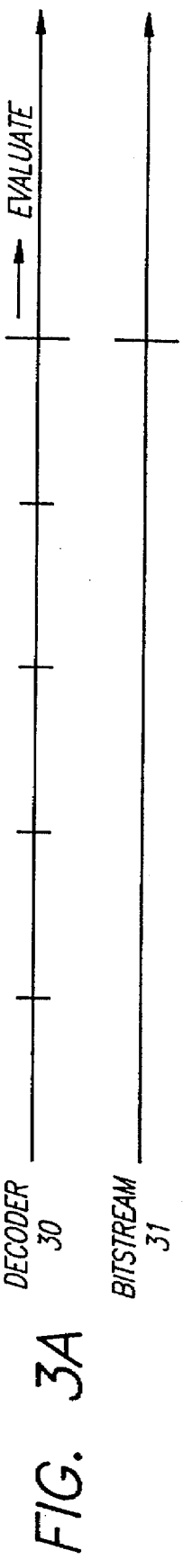
FIGS. 3A, 3B, and 3C are graphical depictions of the timing of the circuit and the correction of serial clocks.
Figure 3B:
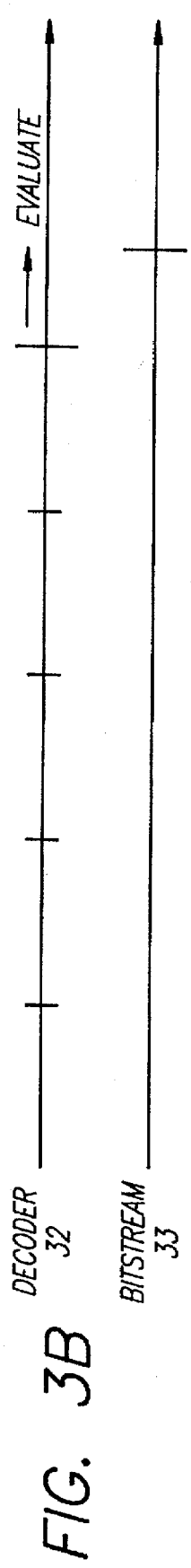
Figure 3C:
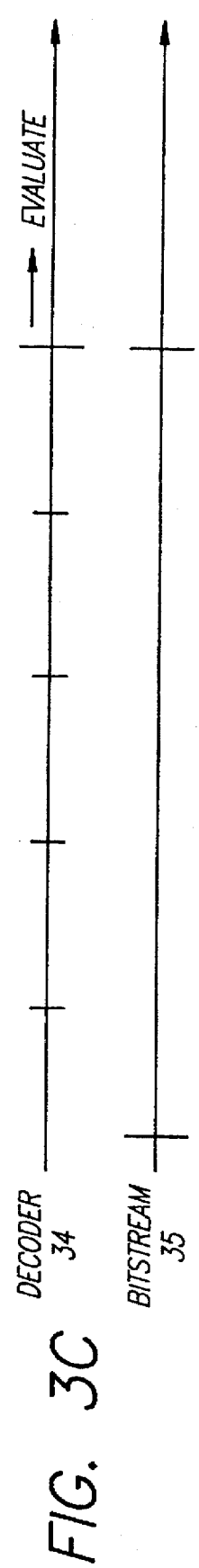

FIGS. 3A, 3B, and 3C illustrate the simple example shown above. For a selected count of 5, bitstream clock 11 operating at 2 hz and the decoder clock 15 operating at 10 hz., in one half second the decoder clock counter 21 would produce a count of 5. Once comparator 22 determines the fifth sample is received, bitstream comparator 23 looks to see if bitstream clock counter 20 has a value of one. In FIG. 3A, first decoder timeline 30 shows that five samples are occurred when evaluation takes place. First bitstream timeline 31 shows that one sample has been received at the time of evaluation, and thus no correction is necessary. Clear line 26 would then operate to clear the counters.

In FIG. 3B, second decoder timeline 32 shows again that five samples have occurred when evaluation takes place. Second bitstream timeline 33 shows that no samples have been received when the evaluation takes place. Correction is therefore necessary, and as the value (zero) is less than the expected count of one, the sample is repeated by repeat sample indicator 25 and clear line 26 operates to clear the counters.

In FIG. 3C, third decoder timeline 34 shows again that five samples have occurred when evaluation takes place. Second bitstream timeline 35 shows that one sample occurred early in the window, and one occurred late in the window. Correction is again necessary, as the number of samples (two) is greater than the expected number of samples received (one). The sample is thus dropped by drop sample indicator 24 and clear line 26 operates to clear the counters.

While the invention has been described in connection with specific embodiments thereof, it will be understood that the invention is capable of further modifications. This application is intended to cover any variations, uses or adaptations of the invention following, in general, the principles of the invention, and including such departures from the present disclosure as come within known and customary practice within the art to which the invention pertains.

What is claimed is:

1. A circuit for synchronizing serial clock signals comprising:
    a bitstream clock source;
    a sampling clock signal source;
    a bitstream counter for counting signals from the bitstream clock source;
    a sample counter for counting signals from the sampling clock signal source;
    determining means for determining a clock count based on bitstream clock source frequency and sampling clock signal frequency;
    means for correcting a bitstream of data samples synchronized with said signals from the bitstream clock source respectively based on output correlated from said sample counter, said clock count, and said bitstream counter.

2. The circuit for synchronizing serial clock signals of claim 1, and further comprising a clear line attached to said bitstream counter and said sample counter, wherein said clear line resets said bitstream counter and said sample counter.

3. The circuit for synchronizing serial clock signals of claim 1, wherein said bitstream counter comprises a circuit which counts said signals from said bitstream clock source.

4. The circuit for synchronizing serial clock signals of claim 3, wherein said sampling clock signal counter comprises a circuit which counts said signals from said sampling clock signal source.

5. The circuit for synchronizing serial clock signals of claim 4, wherein said determining means comprises means for dividing the sampling clock signal frequency by the bitstream clock source frequency.

6. The circuit for synchronizing serial clock signals of claim 1, wherein said correcting means comprises:
    a first comparator for correlating output from said sample counter to said clock count; and
    a second comparator for correlating output from said first comparator to said bitstream counter.

7. The circuit for synchronizing serial clock signals of claim 6, wherein said correcting means further comprises:

data evaluation circuitry for dropping one of said data samples when output from said bitstream counter is greater than output from said second comparator and repeating one of said data samples when output from said bitstream counter is less than output from said second comparator.

8. The circuit for synchronizing serial clock signals of claim 1, wherein said bitstream data samples are audio signals.

9. A method for synchronizing a bitstream clock signal and a local clock signal, comprising the steps of:

counting bitstream clock signal pulses;

counting local clock signal pulses;

determining a predetermined count value;

comparing the count from the local clock signal, the predetermined count value, and the count from the bitstream clock signal; and processing a bitstream of data samples synchronized with said bitstream clock signal pulses respectively based on data received from said comparing step.

10. The method for synchronizing a bitstream clock signal and a local clock signal of claim 9, wherein said comparing step comprises:

correlating the count from the local clock signal to the predetermined count value; and contrasting the count from the comparing step to the count from the bitstream clock signal.

11. The method for synchronizing a bitstream clock signal and a local clock signal of claim 9, and further comprising the step of resetting the count from the first counting step and the count from the second counting step.

12. A synchronization circuit, comprising:

a first counter for counting bitstream clock pulses;

a second counter for counting sampling clock pulses;

a first comparator for producing an output signal when the second counter has counted a number of sampling clock pulses;

a second comparator for producing a count signal having a value equal to a count in the first counter when the first comparator produces said output signal; and a processor for processing a bitstream of data samples synchronized with the bitstream clock pulses in accordance with said value of the count signal.

13. The synchronization circuit of claim 12, wherein said number of sampling clock pulses is substantially equal to a frequency of the sampling clock pulses divided by a frequency of the bitstream clock pulses.

14. A synchronization circuit as in claim 12, further comprising means for resetting the first and second counters in response to said output signal.

15. A synchronization circuit as in claim 12, in which the processor drops one of said data samples when said value of the count signal is greater than one, and repeats one of said data samples when said value of the count signal is less than one.

16. A synchronization circuit as in claim 12, in which the data samples are audio signals.

\* \* \* \* \*